United States Patent
Su et al.

(10) Patent No.: US 7,213,327 B2
(45) Date of Patent: May 8, 2007

(54) METHOD FOR FABRICATING EMBEDDED THIN FILM RESISTORS OF PRINTED CIRCUIT BOARD

(76) Inventors: Sung-Ling Su, 4F, No. 12, Lane 130, Sec. 3, Nan-Kang Rd., Taipei (TW); Zhiqiang Xu, F4, No. 12, Lane 103, Sec. 3, Nan-Kang Rd., Taipei (TW)

( * ) Notice: Subject to any disclaimer, the term of this patent is extended or adjusted under 35 U.S.C. 154(b) by 440 days.

(21) Appl. No.: 10/914,570

(22) Filed: Aug. 7, 2004

(65) Prior Publication Data

US 2005/0196966 A1 Sep. 8, 2005

(30) Foreign Application Priority Data

Mar. 8, 2004 (TW) ............................... 93106057 A

(51) Int. Cl.
*H01C 17/00* (2006.01)
(52) U.S. Cl. ............... 29/610.1; 29/619; 29/620; 29/821; 29/830; 29/832; 29/844; 174/255; 174/260; 338/199; 338/252; 338/311
(58) Field of Classification Search ................ 29/610.1, 29/619–621, 830, 832, 844; 174/255, 260; 338/199, 252, 311
See application file for complete search history.

(56) References Cited

U.S. PATENT DOCUMENTS 6,281,090 B1 * 8/2001 Kukanskis et al. ......... 438/382
6,935,016 B2 * 8/2005 Hashimoto et al. ........... 29/619

* cited by examiner

*Primary Examiner*—A. Dexter Tugbang
*Assistant Examiner*—Tim Phan

(57) ABSTRACT

A method for fabricating the embedded thin film resistors of a printed circuit board is provided. The embedded thin film resistors are formed using a resistor layer built in the printed circuit board. Compared with conventional discrete resistors, embedded thin film resistors contribute to a smaller printed circuit board as the space for installing conventional resistors is saved, and better signal transmission speed and quality as the capacitive reactance effect caused by two connectors of the conventional resistors is avoided. The method for fabricating the embedded thin film resistors provided by the invention can be conducted using the process and equipment for conventional printed circuit boards and thereby saving the investment on new types of equipment. The method can be applied in the mass production of printed circuit boards and thereby reduce the manufacturing cost significantly.

11 Claims, 9 Drawing Sheets

METHOD FOR FABRICATING EMBEDDED THIN FILM RESISTORS OF PRINTED CIRCUIT BOARD

CROSS REFERENCE TO RELATED DOCUMENTS

This application claims priority to TAIWAN Application No. 093106057, filed on Mar. 8, 2004.

FIELD OF THE INVENTION

The present invention generally relates to a printed circuit board, and more specifically to a method for fabricating embedded thin film resistors of a printed circuit board.

BACKGROUND OF THE INVENTION

In general, besides using conventional discrete passive elements, a printed circuit board can also use a thick film or a thin film process to develop the resistors required. In the thick film process, the resistors of the printed circuit board are made of carbon paste printed on the printed circuit board. Then the resistances of the resistors are fine-tuned by the laser trimming. In the thin film process, on the other hand, a nickel-plated copper foil and the epoxy resin of the printed circuit board is pressed together during the fabricating process of the printed circuit board. The nickel-plated side of the copper foil faces toward the printed circuit board and the non-plated side of the copper foil faces outward. Then, in a subsequent photolithography process, an acid etching solution is first used to etch both the copper and nickel layers, and then an alkaline etching solution is used to etch away the copper layer. A number of nickel blocks with the required dimensions are thereby formed. Laser is then used to trim each of the nickel blocks to achieve the precise resistance required.

In addition, currently, there is an electroless deposition technology that can replace the foregoing thin film method for building the resistor blocks to form thin film resistors.

In conventional thick film resistor fabricating methods, using high curing temperature carbon paste for the resistors is rather simple, mature, and less costly. However, because the laminate of the printed circuit board is susceptible to high temperature, low curing temperature carbon paste is usually used. The macromolecular polymer contained in the low curing temperature carbon paste will remain in the formed resistors even after the curing and solidification processes of the resistors. The hydrophilic property of the macromolecular polymer is the major factor causing the resistances of the resistors to vary along with the environmental change. Therefore, resistors having constant and precise resistances are difficult to achieve. On the other hand, the conventional thin film methods use the same temperatures and solutions as the conventional printed circuit board fabrication methods. The fabricated embedded resistors also have better stability and accuracy than those made by thick film methods. However, because the nickel-plated copper foil is difficult to manufacture, there are only limited supply sources and therefore the price is high. Although there are methods using the electroless deposition technology, the fabricated thin film resistors have inadequate adherence due to certain process factors. The application of these methods for mass production is thereby limited. Accordingly, the present invention is aimed at overcoming problems and disadvantages of conventional methods for fabricating thin film resistors of printed circuit boards.

SUMMARY OF THE INVENTION

The method provided by the present invention can be applied to single-sided, double-sided, multi-layered, and build-up printed circuit boards. The present invention develops at least a resistor layer in at least any one layer of the printed circuit board. The resistor layer is then etched to form a number of resistor elements required by the circuit layout of the printed circuit board.

The embedded thin film resistors made by the present invention replace the bulky conventional discrete resistors. The printed circuit board can therefore have finer circuit layout and much smaller size. The capacitive reactance effect usually found at the connectors of conventional discrete resistors is also avoided. The signal transmission speed and quality of the printed circuit board is therefore significantly enhanced, especially for high frequency applications. The process for forming the resistor layer provided by the present invention is very similar to that used for ordinary printed circuit boards and can be carried out using the same equipment. Therefore there is no significant investment on new equipment. The process for forming the resistor layer provided by the present invention, just like the process for ordinary printed circuit boards, is applicable in mass production and contributes to a significant lower manufacturing cost.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
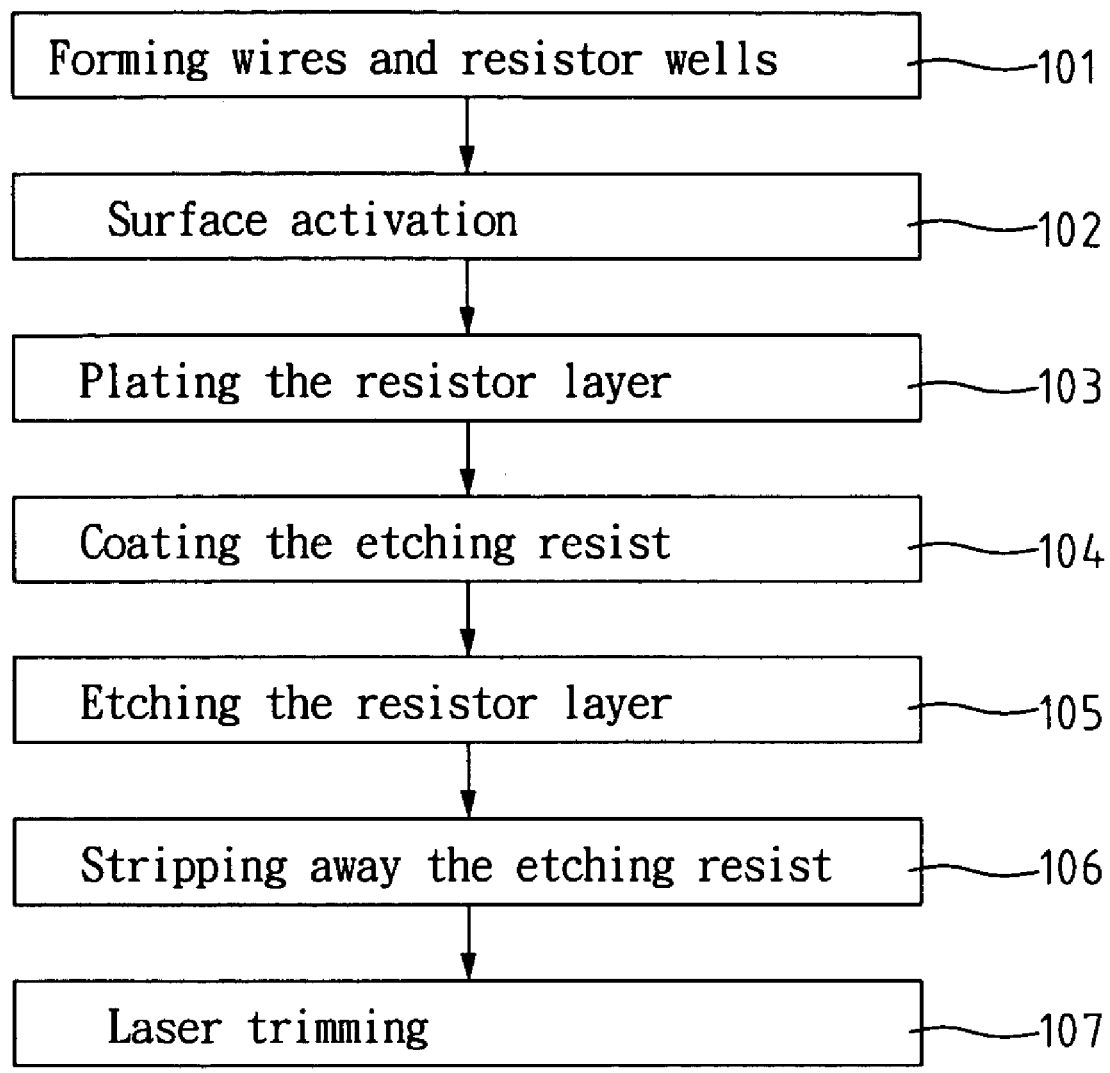
FIG. 1 is a flow chart showing the steps of forming embedded thin film resistors on a printed circuit board according to a first embodiment of the present invention.

FIG. 1 is a flow chart showing the steps of forming embedded thin film resistors on a printed circuit board according to a first embodiment of the present invention. These steps are described sequentially as follows.

Figure 2A:
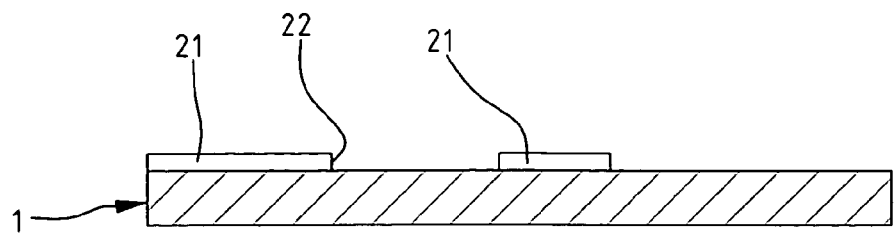
FIGS. 2(a)–2(f) are schematic diagrams showing the various steps of FIG. 1 respectively.

In step 101, as shown in FIG. 2(a), the conductive wires 21 with resistor wells 22 are formed on a substrate made of an insulating polymer according to layout requirement of circuitry.

The foregoing conductive wires 21 and resistor wells 22 can be formed using an ordinary printed circuit board fabrication process such as the subtractive, additive, or semi-additive process. The conductive wire 21 is made of copper, aluminum, other well conductive material, or an alloy of the above.

Figure 2B:
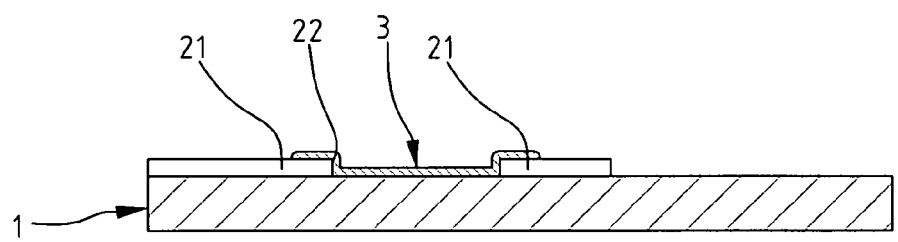

In step 102, as shown in FIG. 2(b), an activated layer 3 is coated on top of at least surface of each resistor well 22 so as to activate the insulating polymer of the substrate 1 exposed by each resistor well 22.

The foregoing activated layer 3 is made of activated palladium (Pd) or other appropriate activator that can be used to form the activated layer using a printing, spraying, or dipping method.

Figure 2C:
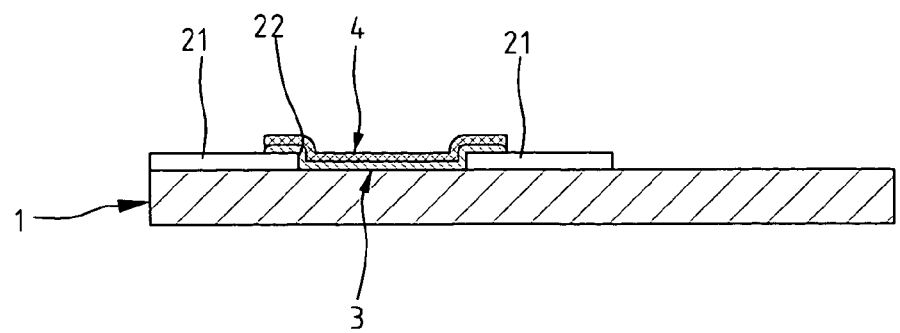

In step 103, as shown in FIG. 2(c), the printed circuit board is immersed in an electroless nickel solution so that a resistor layer 4 with an expected thickness is plated on the activated layer 3.

The foregoing resistor layer 4 can be made of a nickel-phosphorus, palladium-phosphorus, ruthenium-phosphorus, or other metallic material having considerable resistance characteristics.

Figure 2D:
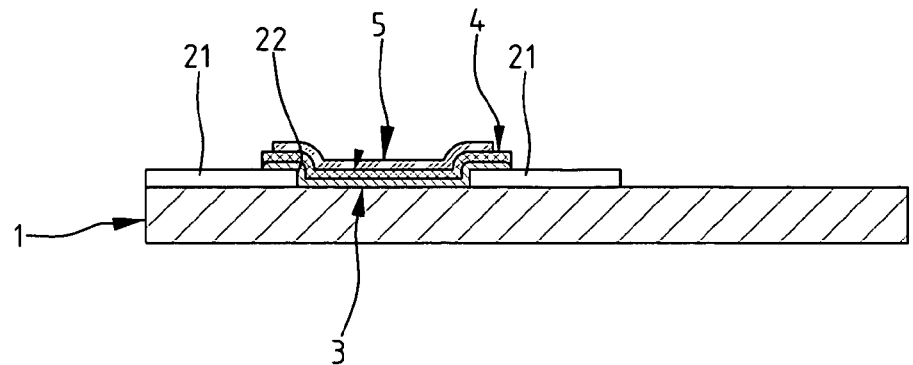

In step 104, as shown in FIG. 2(d), an etching resist 5 is coated on the resistor layer 4, based on the locations and dimensions of the resistors required by the printed circuit board.

The foregoing etching resist 5 is made of etching resistible dry film, wet film, ink, plastic film, or solder mask ink, and can be formed by a screen printing or photolithography process.

Figure 2E:
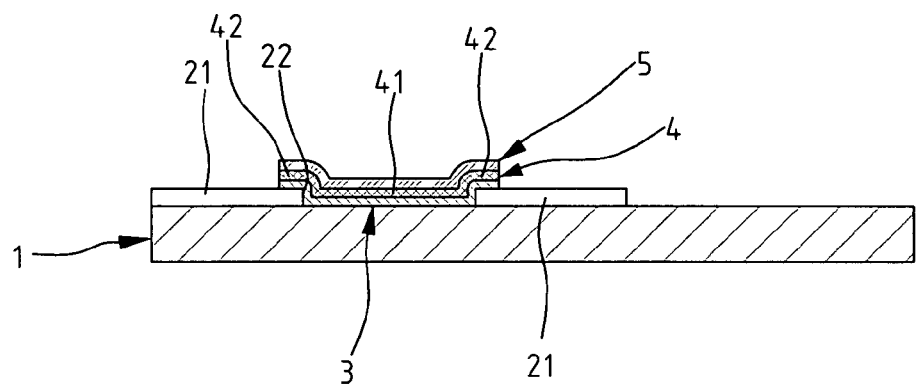

In step 105, as shown in FIG. 2(e), the resistor layer 4 is etched to form a number of resistor elements 41 and contact points 42 matching the locations and dimensions of the etching resist 5. On two ends of each of the resistor elements 41, contact points 42 are formed so that each resistor element 41 is connected to the conductive wires 21.

Figure 2F:
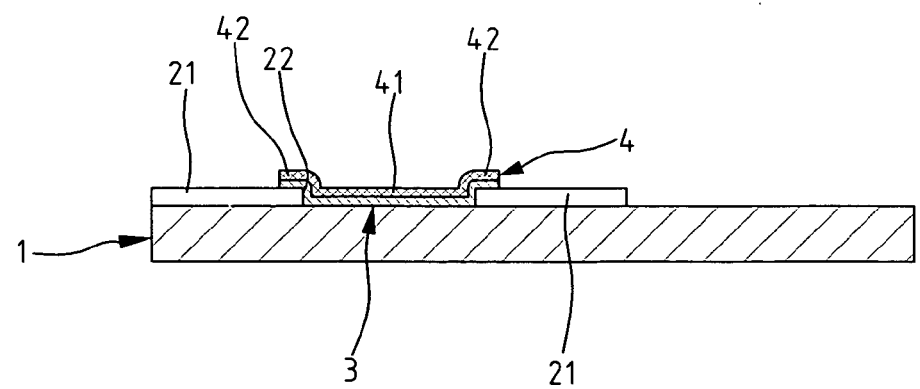

In step 106, as shown in FIG. 2(f), the etching resist 5 on the resistor layer 4 is stripped away.

The foregoing etching resist 5 on the resistor layer 4 may not be stripped away if the etching resist 5 is made of solder mask ink.

In step 107, the shape and dimension of each resistor element 41 of the resistor layer 4 is adjusted to obtain accurate resistance by laser trimming.

At the end of this step, each resistor element 41 of the resistor layer 4 can be coated with protective ink. The protective ink is then heated and solidified so that subsequent processes of the printed circuit board do not affect the resistance of each resistor element 41. The coating and solidification of the protective ink can also be conducted before the laser trimming. In this way, undesirable influence of the ink coating and solidification on the resistances of the resistor elements 41 can be avoided after their resistances are adjusted by laser trimming.

Figure 3:
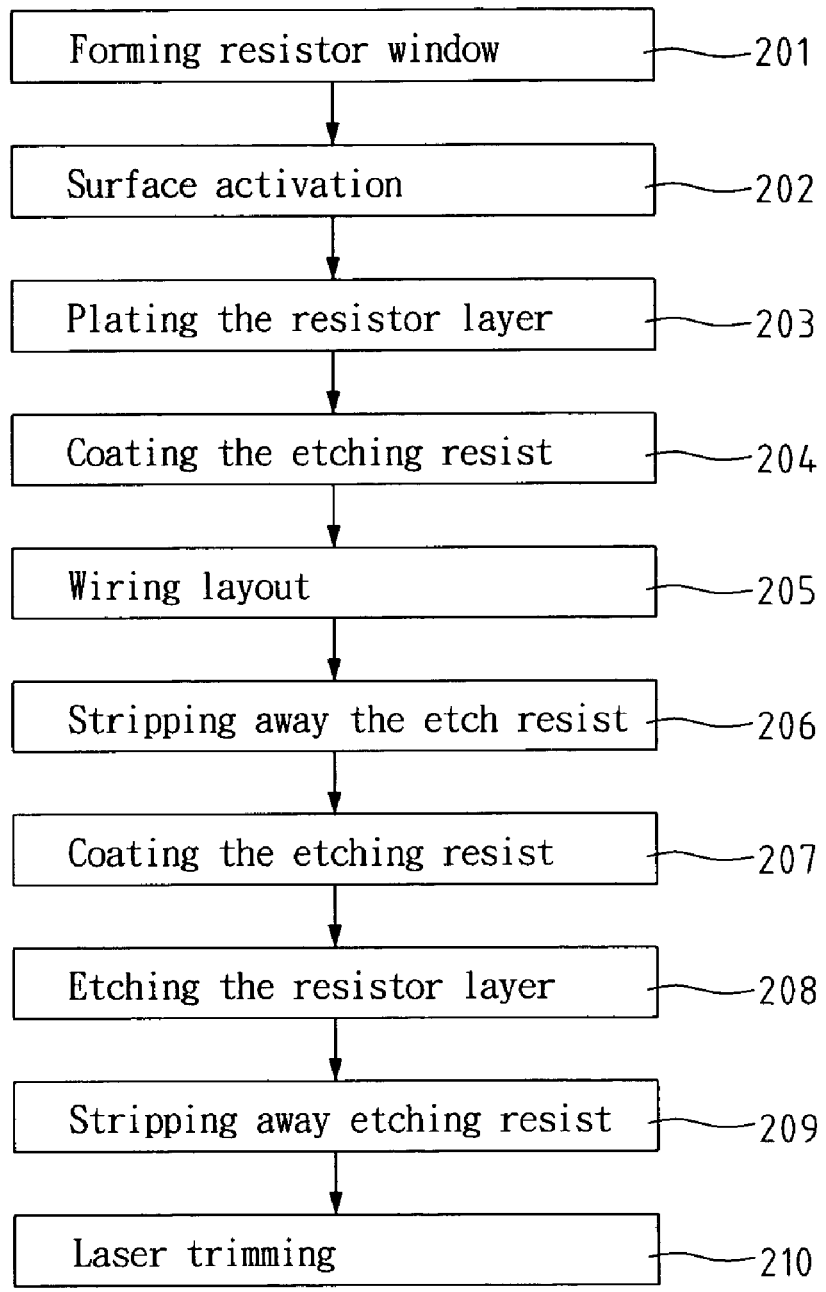
FIG. 3 is a flow chart showing the steps of forming embedded thin film resistors on a printed circuit board according to a second embodiment of the present invention.

FIG. 3 is a flow chart showing the steps of forming embedded thin film resistors on a printed circuit board according to a second embodiment of the present invention. These steps are described sequentially as follows.

Figure 4A:
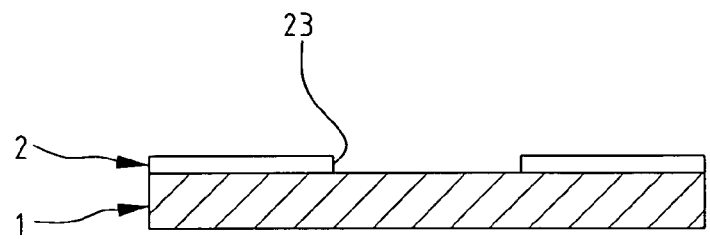
FIGS. 4(a)–4(i) are schematic diagrams showing the various steps of FIG. 3 respectively.

In step 201, as shown in FIG. 4(a), a conductive layer 2 is formed on a substrate 1 made of an insulating polymer. The conductive layer 2 is then processed, based on the locations and dimensions of the resistors required by the printed circuit board, to form the corresponding resistor windows 23.

The conductive layer 2 is made of copper, aluminum, other well conductive material, or an alloy of the above.

Figure 4B:
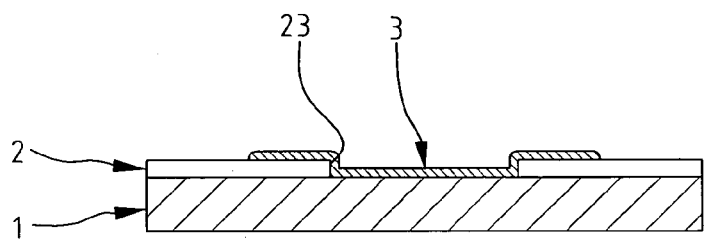

In step 202, as shown in FIG. 4(b), an activated layer 3 is coated on top of at least surface of each resistor window 23 of the conductive layer 2 so as to activate the insulating polymer of the substrate 1 exposed by each resistor window 23.

The foregoing activated layer 3 is made of activated palladium (Pd) or other appropriate activator that can be used to form the activated layer 3 using a printing, spraying, or dipping method.

Figure 4C:
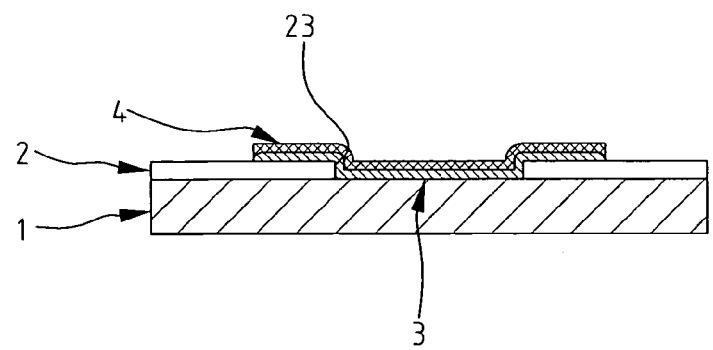

In step 203, as shown in FIG. 4(c), the printed circuit board is immersed in an electroless nickel solution so that a resistor layer 4 with an expected thickness is coated on the activated layer 3.

The foregoing resistor layer 4 can be made of a nickel-phosphorus, palladium-phosphorus, ruthenium-phosphorus, or other metallic material having considerable resistance characteristics.

Figure 4D:
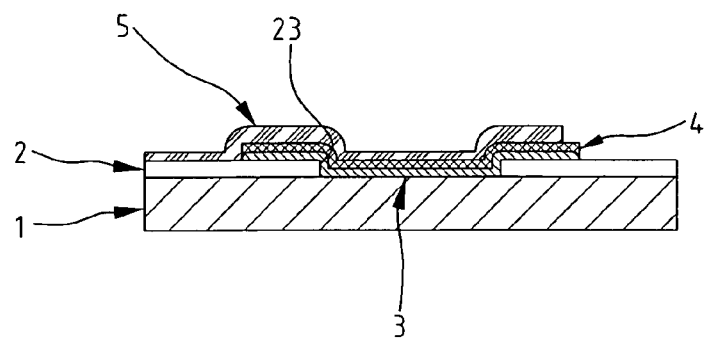

In step 204, as shown in FIG. 4(d), an etching resist 5 is coated on the resistor layer 4, based on the locations and dimensions of the layout of the conductive wires and the resistor windows required by the printed circuit board.

The foregoing etching resist 5 is made of etching resistible dry film, wet film, ink, plastic film, or solder mask ink, and can be formed by a screen printing or photolithography process.

Figure 4E:
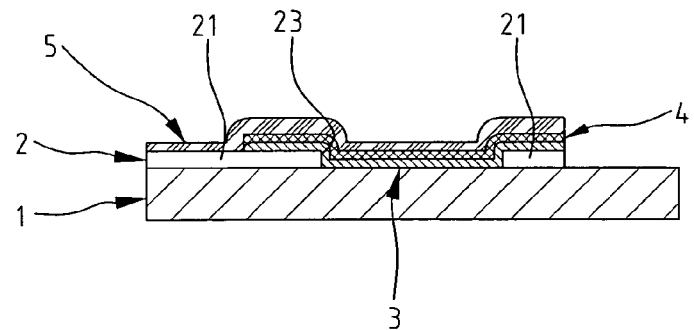

In step 205, as shown in FIG. 4(e), the resistor layer 4 and conductive layer 2 are etched together according to the locations and dimensions of the etching resist 5 so that the layout of conductive wires 21 of the conductive layer 2 and the resistor windows required by the printed circuit board are formed.

Figure 4F:
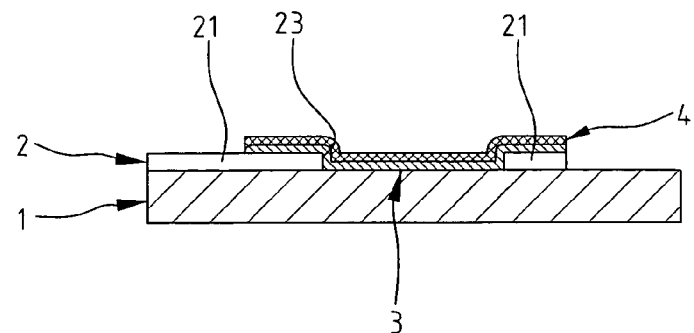

In step 206, as shown in FIG. 4(f), the etching resist 5 on the resistor layer 4 is stripped away.

Figure 4G:
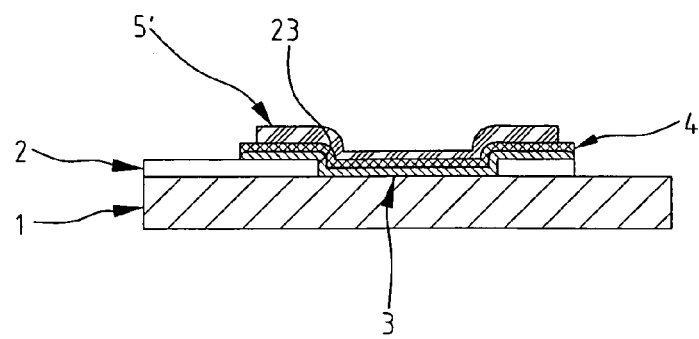

In step 207, as shown in FIG. 4(g), an etching resistible etching resist 5' is coated on the resistor layer 4, based on the locations and dimensions of the resistors required by the printed circuit board.

Figure 4H:
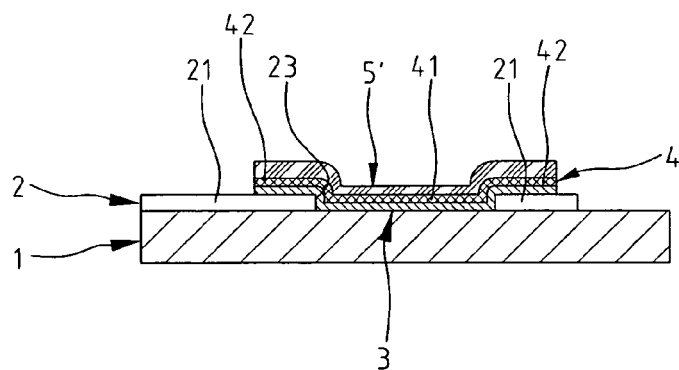

In step 208, as shown in FIG. 4(h), the resistor layer 4 is etched to form a number of resistor elements 41 matching the locations and dimensions of the etching resist 5'. On two ends of the resistor elements 41, contact points 42 are formed to connect with the conductive wires 21 of the conductive layer 2.

Figure 4I:
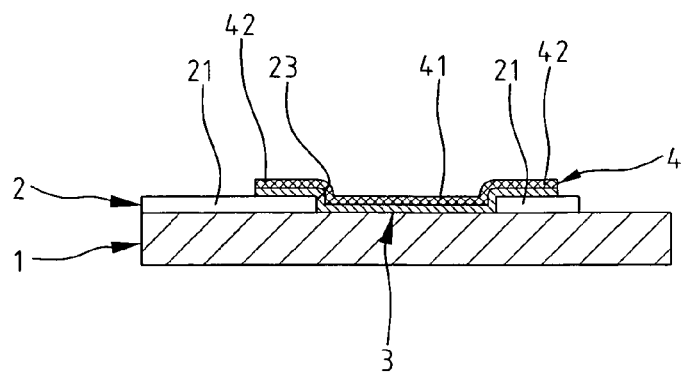
Figure 5A:
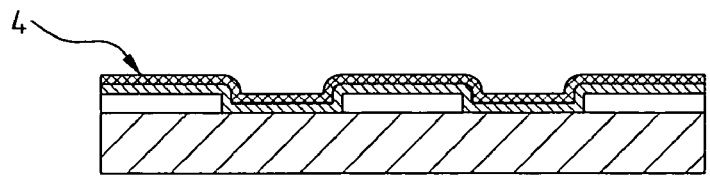
FIGS. 5(a)–5(e) are schematic diagrams showing the various steps of depositing multiple resistor layers respectively according to the present invention.
Figure 5B:
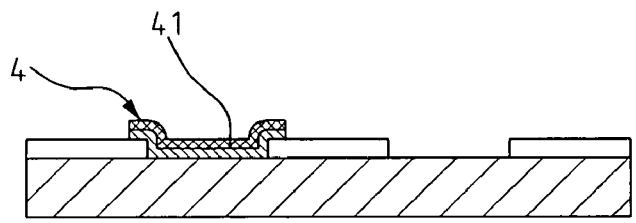
Figure 5C:
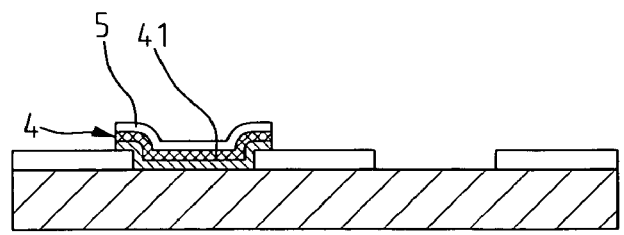
Figure 5D:
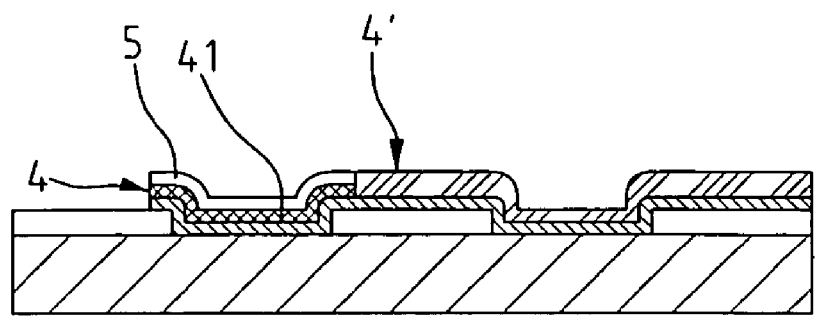
Figure 5E:
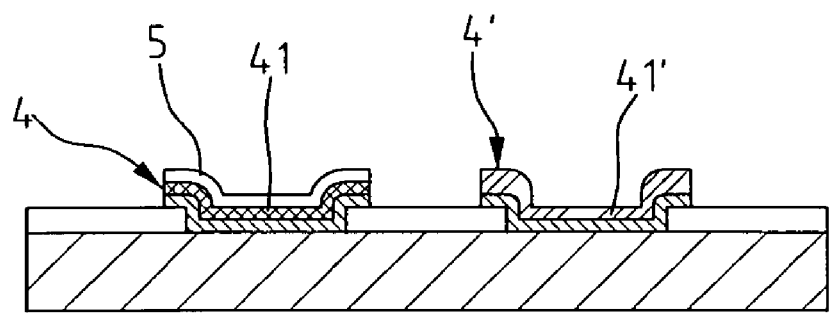

In step 209, as shown in FIG. 4(i), the etching resist 5' on the resistor layer 4 is stripped away.

The foregoing etching resist 5' on the resistor layer 4 may not be stripped away if the etching resist 5' is made of solder mask ink.

In step 210, the shape and dimension of each resistor element 41 of the resistor layer 4 is adjusted to obtain accurate resistance by laser trimming.

In the foregoing steps 205 to 209, the layout of conductive wires 21 is first formed by etching the conductive layer 2 and the resistor elements 41 is then formed by etching the resistor layer 4. If higher degree of accuracy is required, the etching of the conductive layer 2 and resistor layer 4 can be conducted together so that the layout of conductive wires 21 and each of the resistor elements 41 are formed according to the locations and dimensions of the etching resist 5. The etching resist 5 is then stripped away. Subsequently, the conductive layer 2 and resistor layer 4 is coated with another etching resist 5' according to the locations and dimensions of the resistors required by the printed circuit board. Then the superfluous resistor layer 4 on the conductive layer 2 is etched away. Each individual resistor elements 41 has two contact points 42 connecting with the conductive wires 21 of the conductive layer 2. The etching resist 5' is then stripped away.

At the end of the foregoing process, each resistor element 41 of the resistor layer 4 can be coated with protective ink. The protective ink is then heated and solidified so that subsequent processes of the printed circuit board do not affect the resistance of each resistor element 41. The coating and solidification of the protective ink can also be conducted before the laser trimming. In this way, undesirable influence of the ink coating and solidification on the resistances of the resistor elements 41 can be avoided after their resistances are adjusted by laser trimming.

The resistance of the resistor element 41 depends on the thickness and dimension of the resistor element 41, and the volume resistivity of the material used for the resistor layer 4. Since the thickness and volume resistivity of the resistor elements 41 are the same because they are all developed from the same deposition of resistor layer 4, adjusting the dimension of the resistor elements 41 is the only way to differentiate the resistance among the resistor elements 41. For resistor elements 41 having a large resistance, their shape would be much longer or narrower than those having a smaller resistance. Therefore there is a range limitation on the resistance achievable by varying the dimension of the resistor elements 41. To overcome these disadvantages, multiple resistor layers 4 can be deposited. As shown in FIG. 5(*a*), to form a number of resistor elements 41 having similar resistance, a resistor layer 4 having a specific volume resistivity and thickness is deposited first. Then the foregoing process is applied to form the required resistor elements 41 as shown in FIG. 5(*b*). The resistor elements 41 all have identical thickness and volume resistivity. Their resistances are then fine-tuned by adjusting their dimensions. Then, as shown in FIG. 5(*c*), a protective film is coated to protect the resistor elements 41 in subsequent operations. Then, for another set of required resistor elements 41', another resistor layer 4' having a specific volume resistivity and thickness is deposited as shown in FIG. 5(*d*). The same process is repeated to form the required resistor elements 41' as shown in FIG. 5(*e*). The resistor elements 41' all have identical thickness and volume resistivity. Their resistances are then fine-tuned by adjusting their dimensions. Similarly additional resistor layers can be deposited so that resistor elements can have a large variance in their resistances. The process can be conducted on the same layer or on different layers of a printed circuit board if the printed circuit board has more than one layer.

The resistor elements 41 and 41' of the resistor layer 4 and 4' respectively can have their dimensions etched or laser-trimmed simultaneously at the end so as to achieve the desired resistances.

In addition, the method provided by the present invention can be applied to single-sided, double-sided, multi-layered, and build-up printed circuit boards. In these printed circuit boards, at least a resistor layer 4 is formed in at least any one layer of these printed circuit boards and etched to obtain the resistor elements 41 required by the circuit layout of the printed circuit boards. Electrical connections are then established between the resistor elements 41 and the conductive wires 21.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for fabricating embedded thin film resistors of a printed circuit board comprising the steps of:

(a) forming conductive wires according to layout requirement of circuitry on a substrate made of an insulating polymer by a method selected from the group consisting of subtractive, additive, and semi-additive;
   (b) coating an activated layer on each of said resistor wells respectively so as to activate said substrate's insulating polymer exposed by said resistor wells;
   (c) immersing said printed circuit board in a electroless nickel solution so that a resistor layer having a first volume resistivity is plated on said activated layer until said resistor layer is deposited to a first thickness;
   (d) coating an etching resist on said resistor layer based on locations and dimensions of resistors required by said printed circuit board; and
   (e) etching said resistor layer to form a plurality of resistor elements matching said locations and dimensions of said etching resist, wherein each of said resistor elements has two contact points connecting with said conductive wires.

2. The method for fabricating embedded thin film resistors of a printed circuit board according to claim 1, wherein said activated layer is made of an activator that can be formed into said activated layer by a method selected from the group consisting of printing, spraying, and dipping.

3. The method for fabricating embedded thin film resistors of a printed circuit board according to claim 1, wherein said resistor layer is made of a metallic material selected from the group consisting of nickel-phosphorus, palladium-phosphorus, and ruthenium-phosphorous.

4. The method for fabricating embedded thin film resistors of a printed circuit board according to claim 1, wherein said etching resist is formed by a method selected from a group consisting of screen printing and photolithography.

5. The method for fabricating embedded thin film resistors of a printed circuit board according to claim 1, wherein said etching resist is made of an etching resistible material selected from the group consisting of dry film, wet film, ink, plastic film, and solder mask ink.

6. The method for fabricating embedded thin film resistors of a printed circuit board according to claim 1, wherein shapes and dimensions of said resistor elements are adjusted using a laser trimming process after said resistor elements are formed to achieve accurate resistances.

7. The method for fabricating embedded thin film resistors of a printed circuit board according to claim 6, wherein a protective ink is coated on each of said resistor elements after said resistor elements are formed and said protected ink is heated and solidified after said laser trimming process is applied.

8. The method for fabricating embedded thin film resistors of a printed circuit board according to claim 6, wherein a protective ink is coated on each of said resistor elements after said resistor elements are formed and said protected ink is heated and solidified before said laser trimming process is applied.

9. The method for fabricating embedded thin film resistors of a printed circuit board according to claim 1, wherein said steps (c), (d), and (e) are repeated to develop another resistor layer having a second volume resistivity and a second thickness and to form another plurality of resistor elements required by said printed circuit board.

10. The method for fabricating embedded thin film resistors of a printed circuit board according to claim 9, wherein said resistor elements have shapes and dimensions adjusted together after said resistor elements are developed from said resistor layers using a process selected from the group consisting of etching and laser trimming.

11. The method for fabricating embedded thin film resistors of a printed circuit board according to claim 9, wherein said steps (c), (d), and (e) are repeated a plurality of times to develop multiple resistor layers having specific volume resistivity and thickness, and to form resistor elements required by said printed circuit.

* * * * *